(12) United States Patent
Yu et al.

(10) Patent No.: US 7,872,357 B2
(45) Date of Patent: Jan. 18, 2011

(54) PROTECTION FOR BONDING PADS AND METHODS OF FORMATION

(75) Inventors: Chen-Hua Yu, Hsin-Chu (TW); Wen-Chih Chiou, Miaoli (TW); Weng-Jin Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 331 days.

(21) Appl. No.: 12/043,023

(22) Filed: Mar. 5, 2008

(65) Prior Publication Data

US 2009/0224371 A1    Sep. 10, 2009

(51) Int. Cl.
*H01L 23/48* (2006.01)
*H01L 23/52* (2006.01)
*H01L 29/40* (2006.01)

(52) U.S. Cl. .................. 257/777; 438/109; 257/E23.02

(58) Field of Classification Search .................. 257/777, 257/686, E23.02, E23.117, E23.122; 438/109
See application file for complete search history.

(56) References Cited

U.S. PATENT DOCUMENTS

| | | |
|---|---|---|
| 5,627,106 A | 5/1997 | Hsu |
| 5,640,049 A | 6/1997 | Rostoker et al. |
| 5,756,395 A | 5/1998 | Rostoker et al. |
| 6,642,081 B1 | 11/2003 | Patti |
| 6,897,125 B2 | 5/2005 | Morrow et al. |
| 7,365,418 B2 * | 4/2008 | Hsu ............................ 257/686 |
| 7,402,515 B2 | 7/2008 | Arana et al. |
| 7,615,841 B2 | 11/2009 | Chen et al. |
| 2003/0232488 A1 | 12/2003 | Chua et al. |
| 2005/0042867 A1 | 2/2005 | Sanchez et al. |
| 2006/0057836 A1 | 3/2006 | Nagarajan et al. |
| 2007/0216041 A1 | 9/2007 | Patti et al. |
| 2008/0020488 A1 | 1/2008 | Clevenger et al. |
| 2008/0206984 A1 | 8/2008 | Sparks et al. |
| 2008/0220565 A1 | 9/2008 | Hsu et al. |

FOREIGN PATENT DOCUMENTS

JP    2007-0250561    9/2007

\* cited by examiner

*Primary Examiner*—Matthew C Landau
*Assistant Examiner*—Jessica Hall
(74) *Attorney, Agent, or Firm*—Slater & Matsil, L.L.P.

(57) ABSTRACT

The formation of bonding pad protective layer over exposed bonding pad materials between stacked integrated circuit (IC) dies or wafers is described in preferred embodiments in which the bonding pad protective layer is formed in the integrated process of forming wafer bonding pads. The bonding pad protective layer prevents the exposed bonding pad materials from oxidation and corrosion in open-air or other harsh environments. By providing a bonding pad protective layer on exposed bonding pad materials, significant product reliability improvement is expected on ICs having a three-dimensional "stacked-die" configuration.

18 Claims, 14 Drawing Sheets

PROTECTION FOR BONDING PADS AND METHODS OF FORMATION

CROSS-REFERENCE TO RELATED APPLICATIONS

This application relates to the following co-pending and commonly assigned patent application Ser. No. 11/769,559 filed on Jun. 27, 2007, entitled "Forming of Through Via before Contact Processing," which application is hereby incorporated herein by reference.

TECHNICAL FIELD

The present invention relates generally to integrated circuit fabrication, and more particularly to forming protective layers for wafer and/or die bonding pads.

BACKGROUND

In modern integrated circuits, the speed at which an integrated circuit operates is generally limited, among other things, by the distance between the farthest separated components that communicate with each other on the chip. Laying out circuits as three-dimensional structures has been shown to significantly reduce the communication path length between on-chip components, provided the vertical distances between layers are smaller than the chip width of the individual layers. Thus, by stacking circuit layers vertically, the overall chip speed is typically increased. One method that has been used to implement such stacking is through wafer bonding.

Wafer bonding generally is the joining together of two or more semiconductor wafers on which integrated circuitry has been formed. Wafers are typically joined by direct bonding of external oxide layers or by adding adhesives to inter-level dielectric layers. The bonded result produces a three-dimensional wafer stack which is subsequently diced into separate stacked die, with each individual stacked die having multiple layers of integrated circuitry. In addition to the increased speed that the three-dimensional circuitry typically experiences, wafer stacking offers other potential benefits, including improved form factors, lower costs, and greater integration through system on chip (SOC) solutions. In order to enable the various components integrated within each stacked die, electrical connections between stacked dies are formed that provide conduction between the various components in the stacked dies. Such an electrical connection typically comprises through silicon vias (TSVs) formed in a die connecting to the underlying circuitry, and bonding pads that are metal areas formed on the front surface of a die. The bonding pads are electrically connected to the TSVs and have increased bonded area, thus facilitating the connections between stacked dies.

In general, bonding pads are slightly elevated from a surface of a die in order to perform desired bonding. After the bonding pads are formed on the dies, one of the dies is turned over so that its bonding pads are position over the corresponding bonding pads of a base die. The two dies may be pressed together and bonded using a typical thermal diffusion bonding process. The two dies may also be bonded together using an adhesive bonding process. Examples of such bonding methods are described in U.S. Pat. No. 6,642,081 to Patti (hereinafter Patti) and U.S. Pat. No. 6,897,125 to Morrow, et al., (hereinafter Morrow). Patti describes forming bonding by a thermal diffusion bonding process, while Morrow describes forming wafer bonding using a thermal diffusion bonding process or an adhesive bonding process.

One disadvantage of the existing bonding methods is that, after bonding, the bonding pad metal materials, such as copper, are exposed to air or other unprotected ambient environment in the open space between the dies. This problem can cause reliability concerns with the metal material bonding pads due to metal oxidation and corrosion in open-air or other harsh environments. This may be exacerbated by the fact that, in advanced technology, the dimensions of an inter-wafer bonding pad continue to decrease, while the density of the inter-wafer bonding pads increases significantly. There are generally hundreds or more of inter-wafer bonding pads in an integrated circuit having a three-dimensional stacked-die configuration.

SUMMARY OF THE INVENTION

These and other problems are generally solved or circumvented, and technical advantages are generally achieved, by preferred embodiments of the present invention which provide for the formation of an oxidation/corrosion protective layer over the exposed portions of the bonding pads in the open space between the dies in an integrated circuit having a stacked die configuration. The methods in preferred embodiments offer the flexibility of forming the protective/corrosion layer prior to, in combination with, or after the bonding pads bonding process that joins the stacked dies together.

In accordance with a preferred embodiment of the present invention, a stacked integrated circuit (IC) comprises a first semiconductor die that has a front side and a back side. The first semiconductor die contains one or more semiconductor devices. Covered on the front side of the first semiconductor die is a first insulation layer that comprises one or more first bonding pads, which are electrically connected to the semiconductor devices formed in the first semiconductor die. Each of the one or more first bonding pads has a bonding surface and a perimeter surface. The stacked IC also comprises a second semiconductor die that is bonded to the first semiconductor die at the bonding surface of the one or more first bonding pads. A protective layer is disposed on the perimeter surface of each of the one or more first bonding pads in a gap between the first insulation layer of the first semiconductor die and the second semiconductor die.

In accordance with another preferred embodiment of the present invention, a method of fabricating a stacked integrated circuit (IC) semiconductor die comprises the following steps. A first semiconductor die is provided having one or more first bonding pads on a front side of the first semiconductor die. A second semiconductor die is also provided having one or more second bonding pads on a front side of the second semiconductor die. The first and the second semiconductor dies are positioned such that the one or more first bonding pads on the first semiconductor die are aligned and brought into contact with the respective one or more second bonding pads on the second semiconductor die. A bonding process bonds the one or more first bonding pads on the first semiconductor die to the respective one or more second bonding pads on the second semiconductor die. A protective layer is formed on the exposed portions of the one or more first and one or more second bonding pads between the front side of the first semiconductor die and the front side of the second semiconductor die.

In accordance with another preferred embodiment of the present invention, a method of fabricating a stacked integrated circuit (IC) comprises the steps in the following order. Firstly, it is provided a first semiconductor die having one or more first bonding pads on a first front side of the first semiconductor die and a second semiconductor die having one or more second bonding pads on a second front side of the second semiconductor die. Secondly, the first and the second semiconductor dies are positioned in a bonding equipment chamber such that the one or more first bonding pads on the first semiconductor die are aligned and brought into contact with the respective one or more second bonding pads on the second semiconductor die. Subsequently, a reactive gas is introduced into the bonding equipment chamber where the reactive gas reacts with the exposed portions of the one or more first and the one or more second bonding pads. A bonding process follows to join the one or more first bonding pads on the first semiconductor die to the respective one or more second bonding pads on the second semiconductor die with the bonding equipment. Finally, an anneal process is performed on the one or more first bonding pads of the first semiconductor die and the one or more second bonding pads of the second semiconductor die.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
FIGS. 1A-1I are cross-sectional views of a wafer having a TSV formed according to one embodiment of the present invention.
Figure 1B:
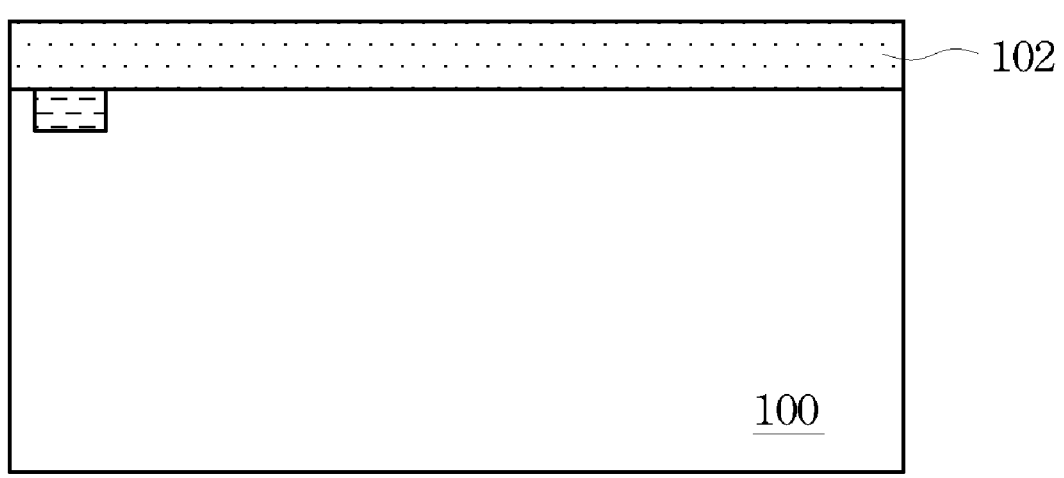
Figure 1C:
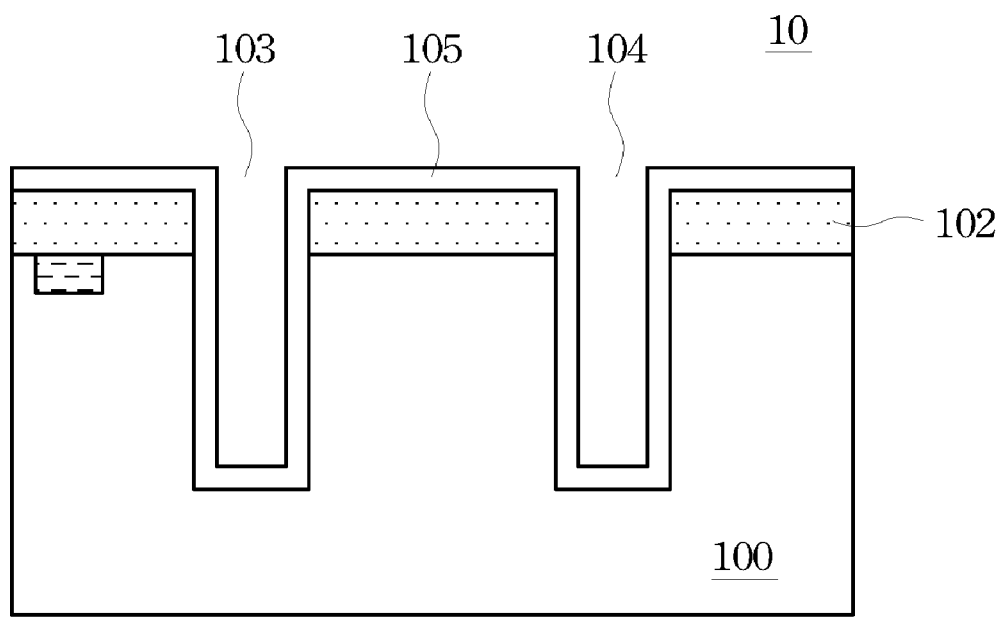

With reference now to FIG. 1A, there is shown a portion of a cross-sectional diagram of wafer 10. Wafer 10 comprises substrate 100, which is typically silicon (Si), but may also be made of gallium arsenide (GaAs), gallium arsenide-phosphide (GaAsP), indium phosphide (InP), gallium aluminum arsenic (GaAlAs), indium gallium phosphide (InGaP), and the like, and illustrates device 101 processed from substrate 100. Device 101 may comprises one or more known active and passive devices formed on substrate 100, such as transistors, diodes, resistors, capacitors, and inductors. In FIG. 1B, insulating layer 102 is deposited on substrate 100 of wafer 10. One example of such insulating material that may be used is phosphosilicate glass (PSG). Etching is performed on wafer 10 to create via recesses 103 and 104, as shown in FIG. 1C. In order to prevent any conducting material from diffusing into any active portions of the circuitry of wafer 10, liner oxide 105, such as silicon nitride, is deposited in a layer over wafer 10, including via recesses 103 and 104.

Figure 1D:
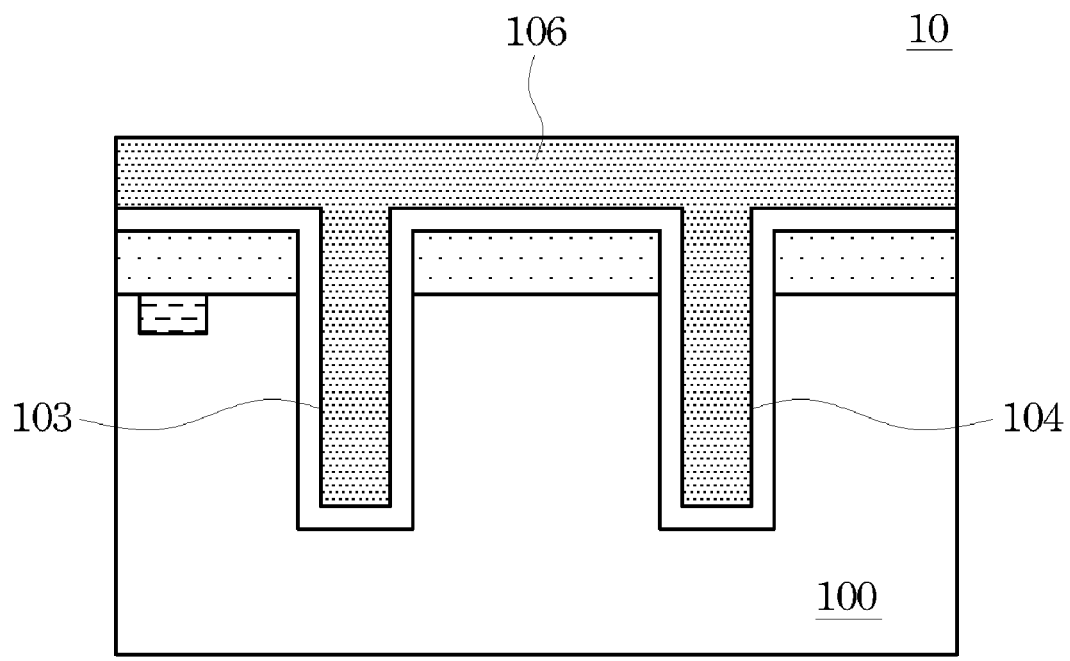
Figure 1E:
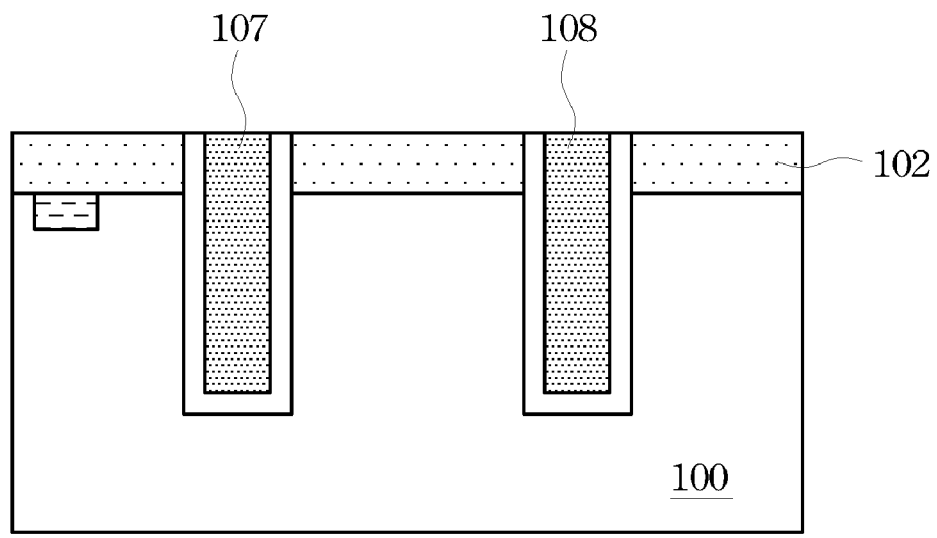
Figure 1F:
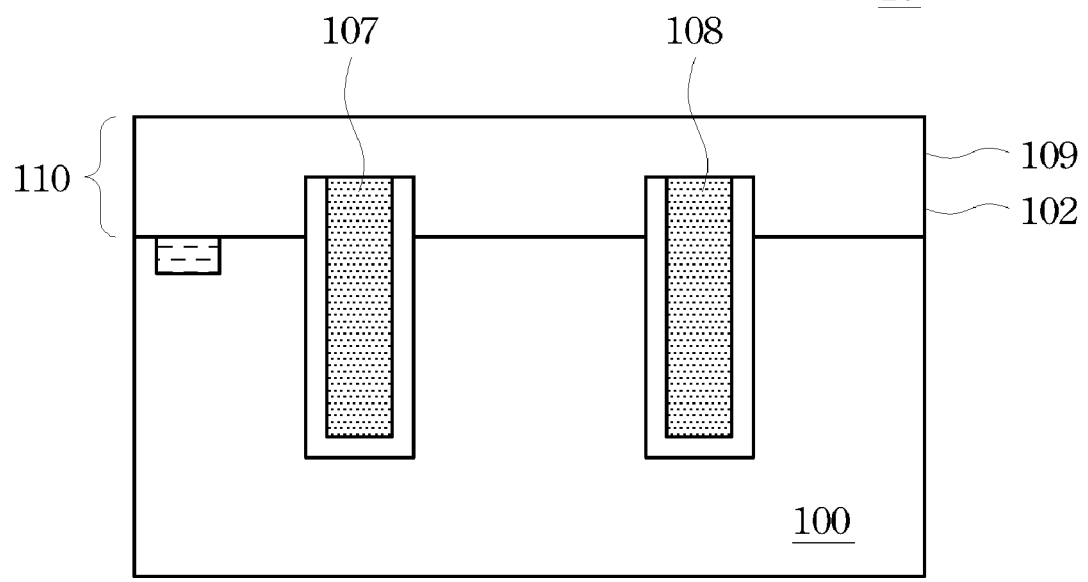

A layer of conducting material, conductor 106, is deposited onto wafer 10, as shown in FIG. 1D. Conducting material may comprise various materials, such as copper, tungsten, aluminum, gold, silver, and the like. Conductor 106 fills via recesses 103 and 104. After removing the excess portions of conductor 106, either through etching, chemical mechanical polishing (CMP), or the like, wafer 10 now comprises vias 107 and 108 deposited in substrate 100 and insulating layer 102, as shown in FIG. 1E. Additional insulating layer 109 is added on top of insulating layer 102 to form combined insulating layer (ILD) 110, as illustrated in FIG. 1F, resulting in vias 107 and 108 being enclosed within wafer 10.

Figure 1G:
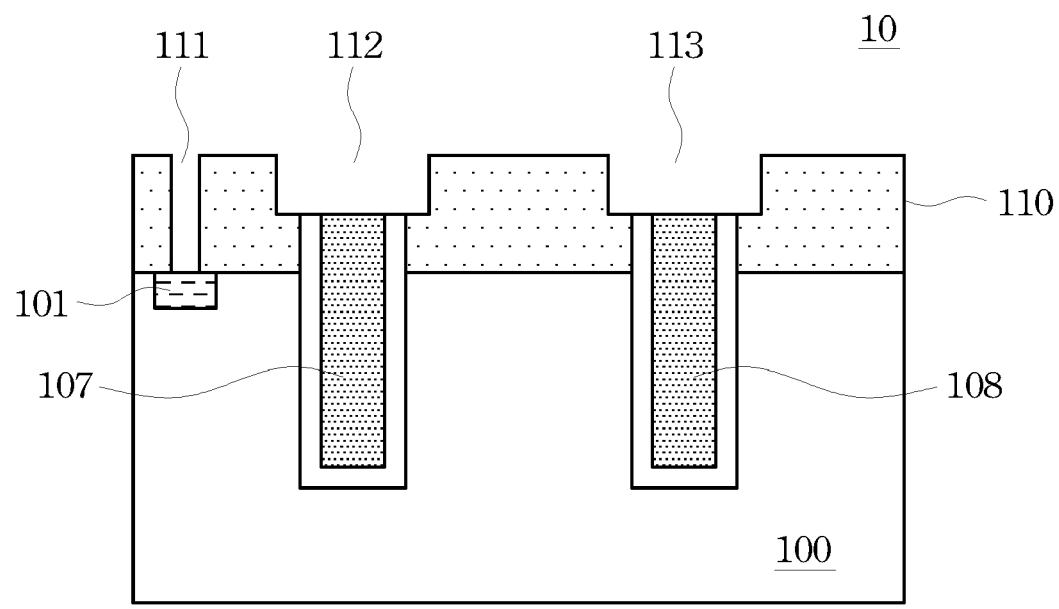
Figure 1H:
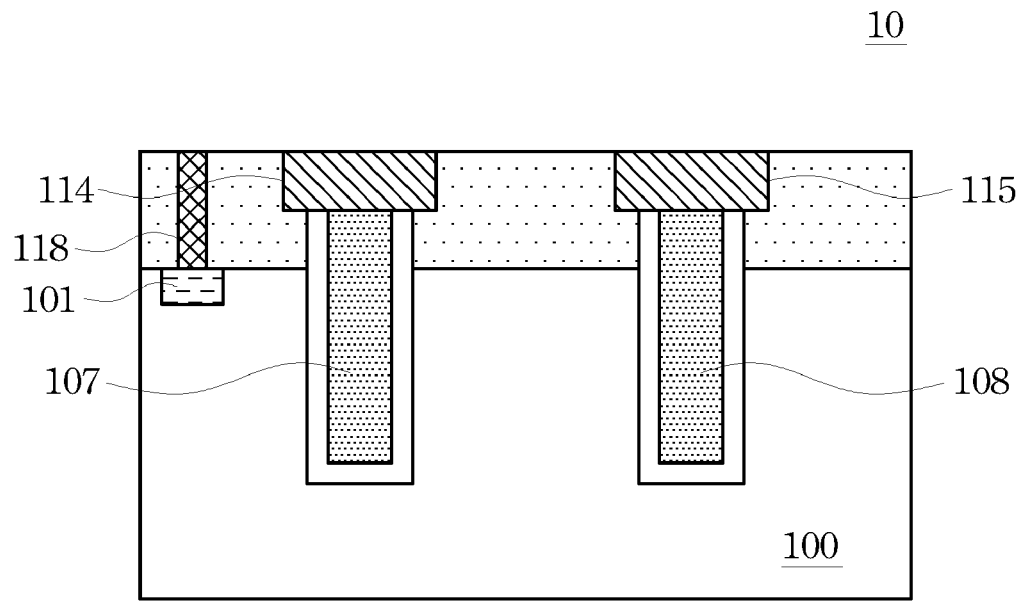

Another set of etching processes creates recesses 111-113, as shown in FIG. 1G, that provide contact to device 101 and vias 107 and 108, respectively through ILD layer 1 10. FIG. 1H illustrates wafer 10 in cross-section after conducting material is deposited onto wafer 10 filling in recesses 111-113 (FIG. 1G). Portions of this conducting material are then removed through a process, such as CMP, to create pad 114, pad 115, and connector 118, providing contact to device 101.

It should be noted that an interface exists between contact pads 114 and 115 and vias 107 and 108. This interface may comprise a direct connection, as illustrated in FIG. 1H, but may also comprise an indirect connection. The various embodiments of the present invention are not limited to only direct connection interfaces between contacts and vias.

Figure 1I:
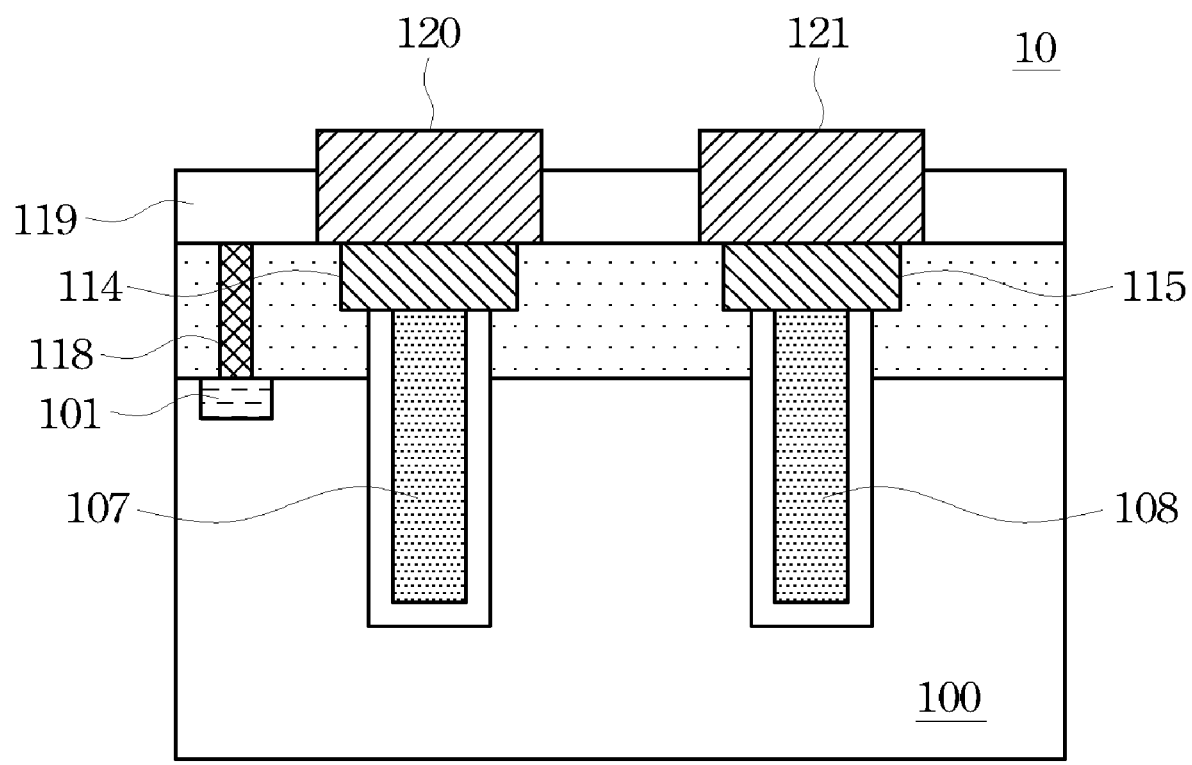

Bonding contacts 120 and 121, as shown in FIG. 1I, are formed by depositing intermetal dielectric (IMD) layer 119, which insulates device 101 from any other circuitry or devices in any wafers bonded to wafer 10. Recesses are etched into IMD layer 119 into which conducting material is deposited to form bonding contacts 120 and 121. The insulation or dielectric material making up IMD layer 119 is removed or etched to reveal bonding contacts 120 and 121 slightly elevated above the top of IMD layer 119.

It should be noted that any of several different conductive materials may be used to create the bonding pads in the various preferred embodiments of the present invention. The conductive materials used to form bonding contacts 120 and 121 may be copper, tungsten, gold, aluminum, aluminum-copper, copper-tin alloy, gold-tin alloy, indium-gold alloy, lead-tin alloy, copper-silver-tin alloy, combinations thereof, or the like. The present invention is not intended to be limited to any one or a simple set of such conductive materials.

It should also be noted that the bonding contacts 120 and 121 are not limited to the positions in relation to contact pads 114 and 115, as illustrated in FIG. 1I. However, a connection between bonding contacts 120 and 121 to contact pads 114 and 115 should exist in some manner, such as a redirection layer, conducting traces, or the like.

Figure 1J:
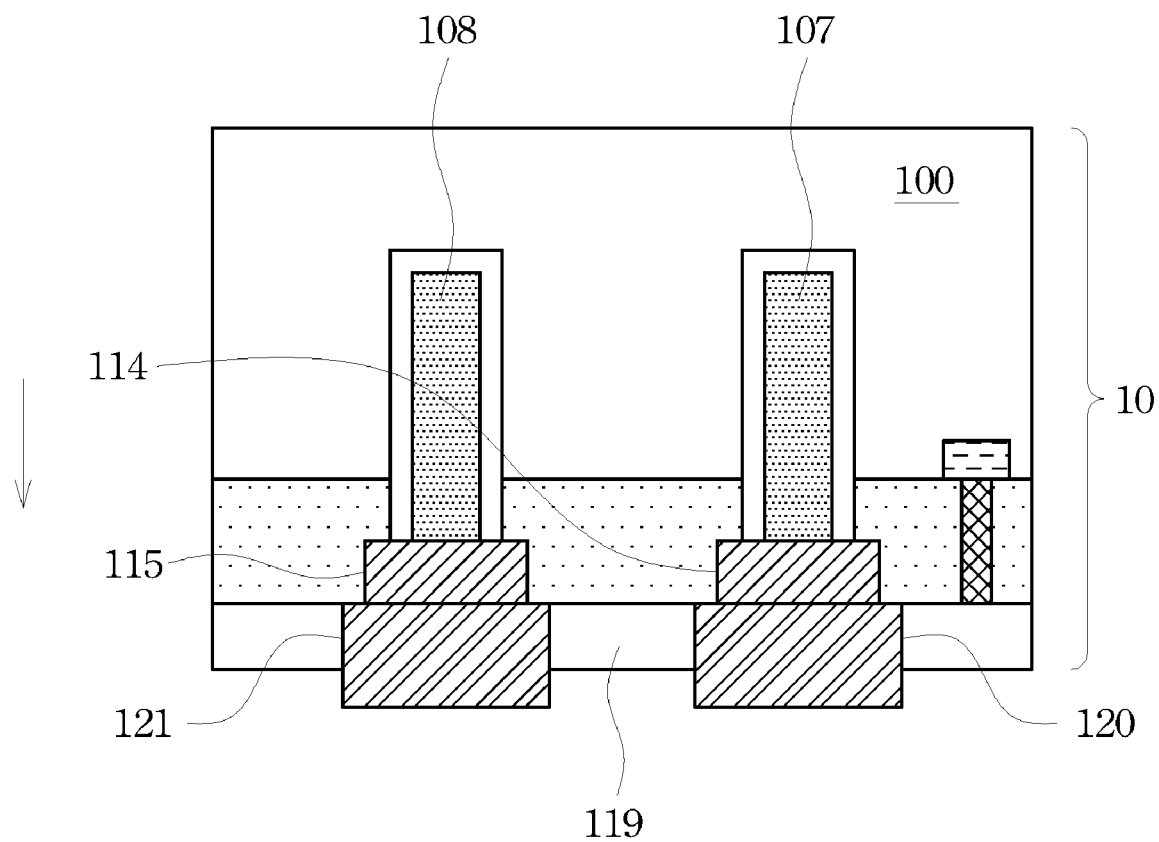
FIGS. 1J-1N are cross-sectional views of two wafers bonded together according to one embodiment of the present invention.
Figure 1J:
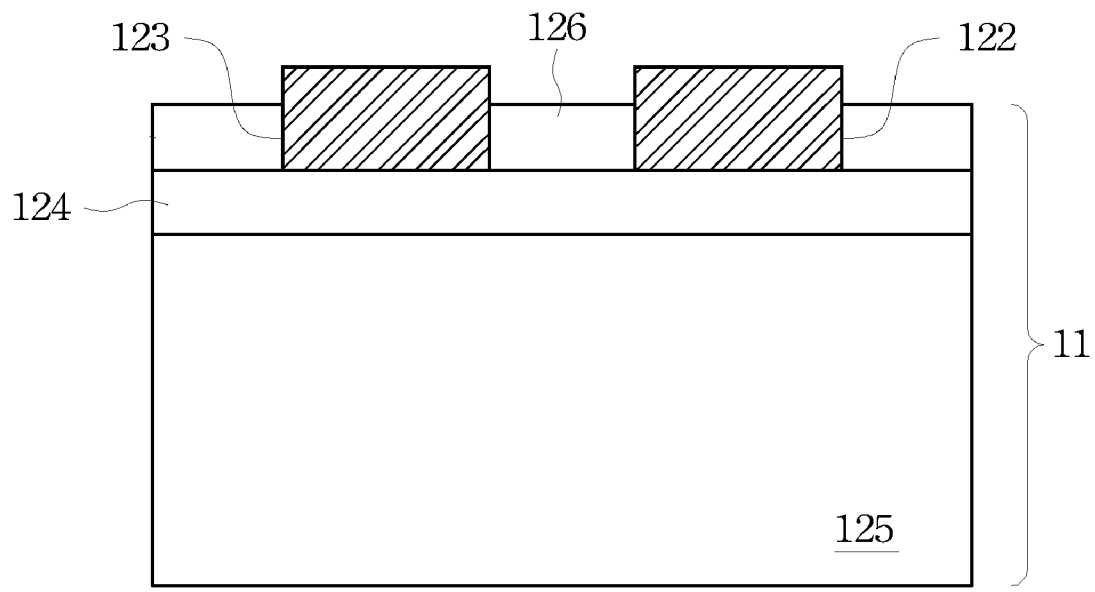

FIG. 1J illustrates the cross-section of wafer 10 that is to be bonded to first wafer 11. Wafer 11 comprises substrate 125, insulating layer 124, IMD layer 126, and bonding pads 122 and 123 slightly elevated above the top of IMD layer 126. Wafer 11 may also comprises one or more active and passive devices (not shown) formed on substrate 125. Each of wafer 10 and 11 include an intermetal dielectric layer, IMDs 119 and 126 respectively, to limit interference between the various components on either wafer. Wafers 10 and 11 are to be bonded together at bonding pads 120-121 and 122-123 to form a stacked wafer configuration.

Figure 1K:
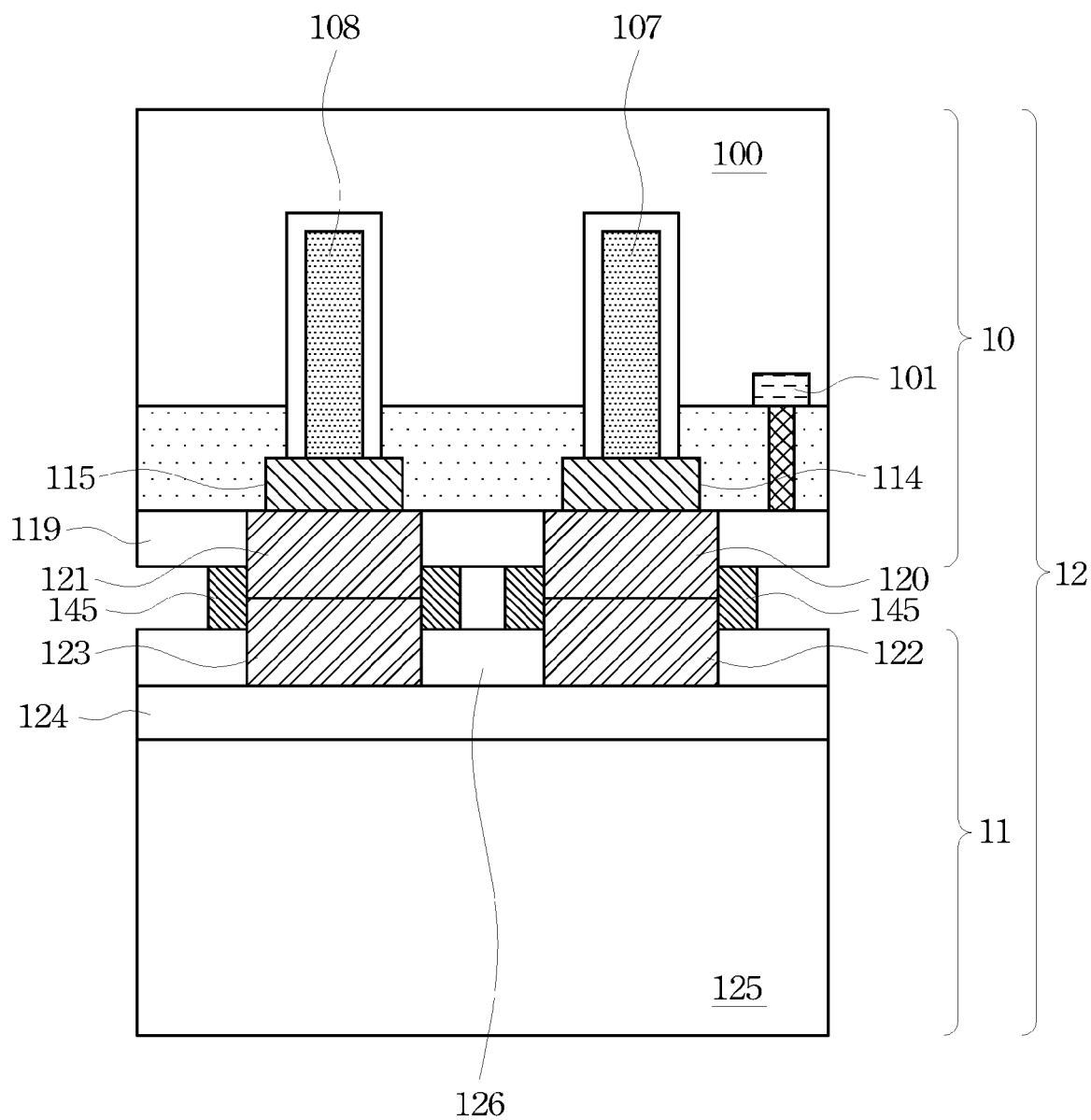

It should be noted that any number of different devices, components, connectors, and the like may be integrated into wafers 10 and 11. The specific devices or lack of devices that may be illustrated herein are not intended to limit the embodiments of the present invention in any way.

FIG. 1K illustrates the cross-section of a stacked wafer 12 formed by bonding wafer 10 and 11 of FIG. 1J using the preferred wafer bonding methods of the present invention as will be described below. Wafers 10 and 11 are bonded together at bonding pads 120-121 and 122-123 to form stacked wafer 12. Furthermore, protective layer 145 is formed over the exposed portions of bonding pads 120-121 and 122-123, as shown.

In an additional and/or alternative embodiment, the bonding pads on either of wafers 10 and 11 or both are not elevated above the top of their respective IMD layers, such as IMD layers 119 and 126 in FIG. 1J. In other word, the bonding pads on wafers 10 and 11 may be level with or recessed below their respective IMD layers. However, the preferred process flows of bonding stacked wafers and forming a bonding pads protective layer may be performed serving, at least, a precautionary purpose in case bonding pad metal exposure occurs due to unintended process errors. These process errors may include bonding pad misalignment, non-uniform bonding pad surfaces, particles on bonding pad surfaces, and the like. That is, the present invention is not limited to use with only wafers or dies having elevated bonding pads.

Figure 1L:
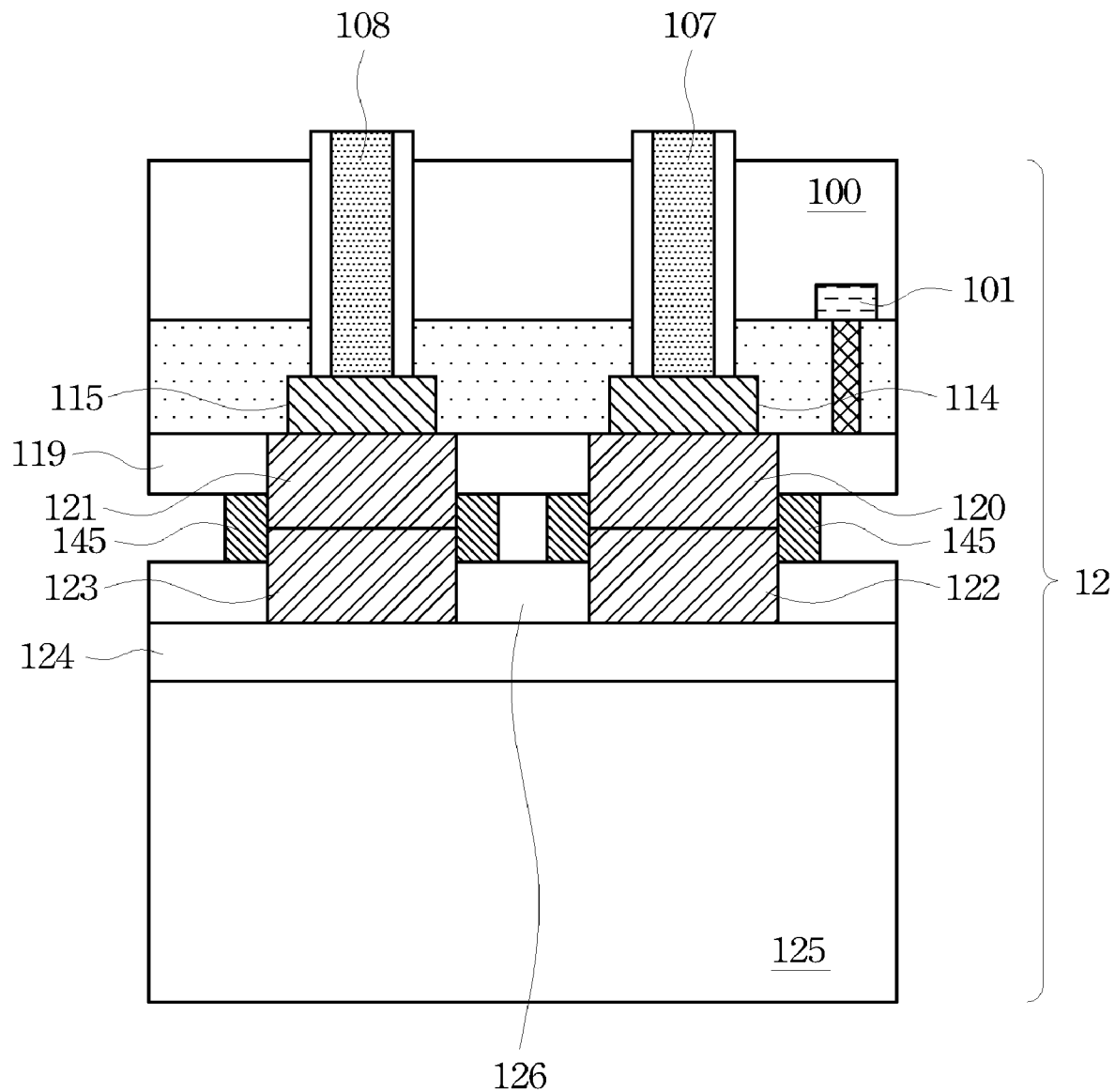
Figure 1M:
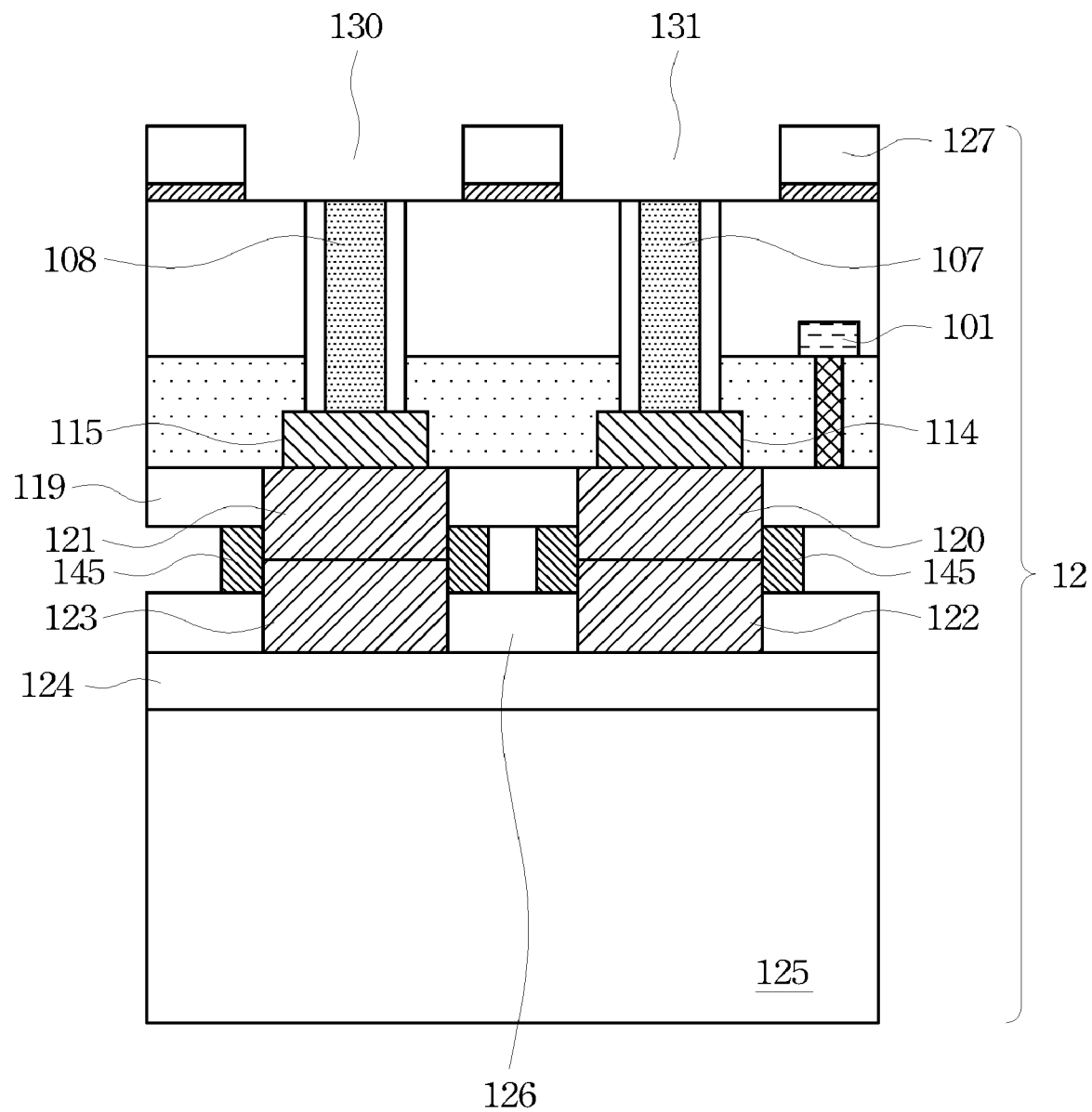
Figure 1N:
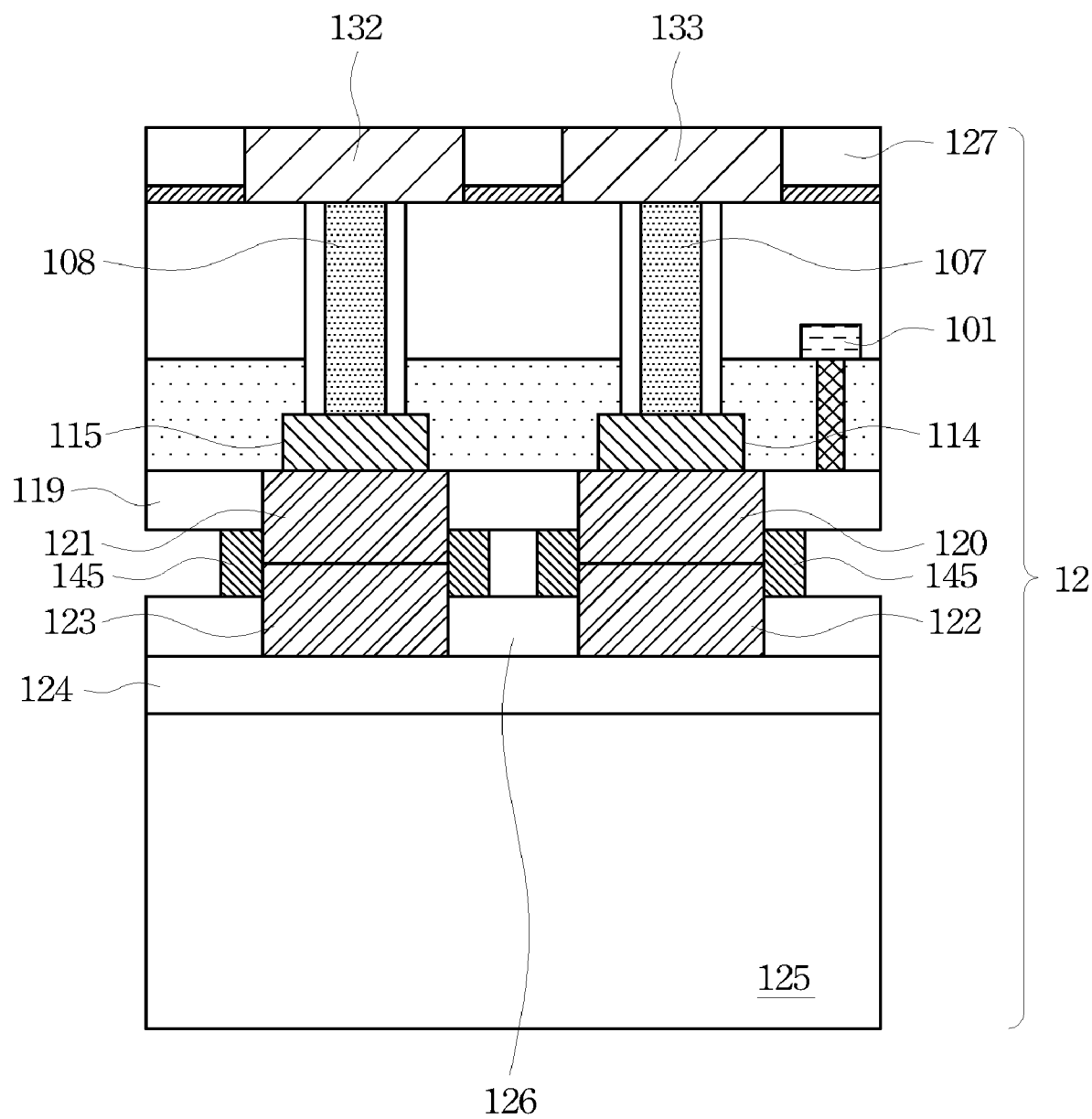

FIG. 1L is a cross-sectional view of stacked wafer 12 configured to provide back-side contact points for vias 107 and 108. Portions of substrate 100 are removed through a wafer thinning process, such as etching, CMP, or the like, to reveal contact points with vias 107 and 108. In removing such portions of substrate 100, vias 107 and 108 may slightly protrude from substrate 100. Metallization insulator layer 127 is deposited onto stacked die 12 over the protruding edges of vias 107 and 108, as shown in FIG. 1M. Metallization insulator layer 127 comprises layers of insulating material with a layer of liner material to prevent any metals deposited in the metallization process from diffusing into stacked wafer 12. Recesses 130 and 131 are then etched from metallization insulator layer 127. The metallization process results in the formation of contact pads 132 and 133, as shown in FIG. 1N. A metal, such as copper, tungsten, aluminum, or the like, is deposited over metallization insulation layer 127 and then the excess portions of metal on the wafer surface are removed through a known etch, CMP process, or the like.

The stacking process may be continued by connecting contact pads 132 and 133 to the contact pads on the bonding surface of another wafer that is added to the stack. Devices in the different stacked wafers are electrically connected through TSV vias, such as 107 and 108.

It should be noted that only a limited number of active devices, such as active device 101, and TSV vias, such as vias 107 and 108, are shown for the ease of illustration and clarity. However, those of ordinary skill in the art will appreciate that, in practice, the integrated circuitry associated with integrated circuits and stacked die may include millions or even tens of millions or more active devices and, further, that interconnect structures may include tens or even hundreds of conductors in the uppermost ILD layers. Similarly, those of ordinary skill in the art will appreciate that each stacked die may, in practice, include dozens or hundreds of back-side connections using conductive vias and leads.

Figure 2:
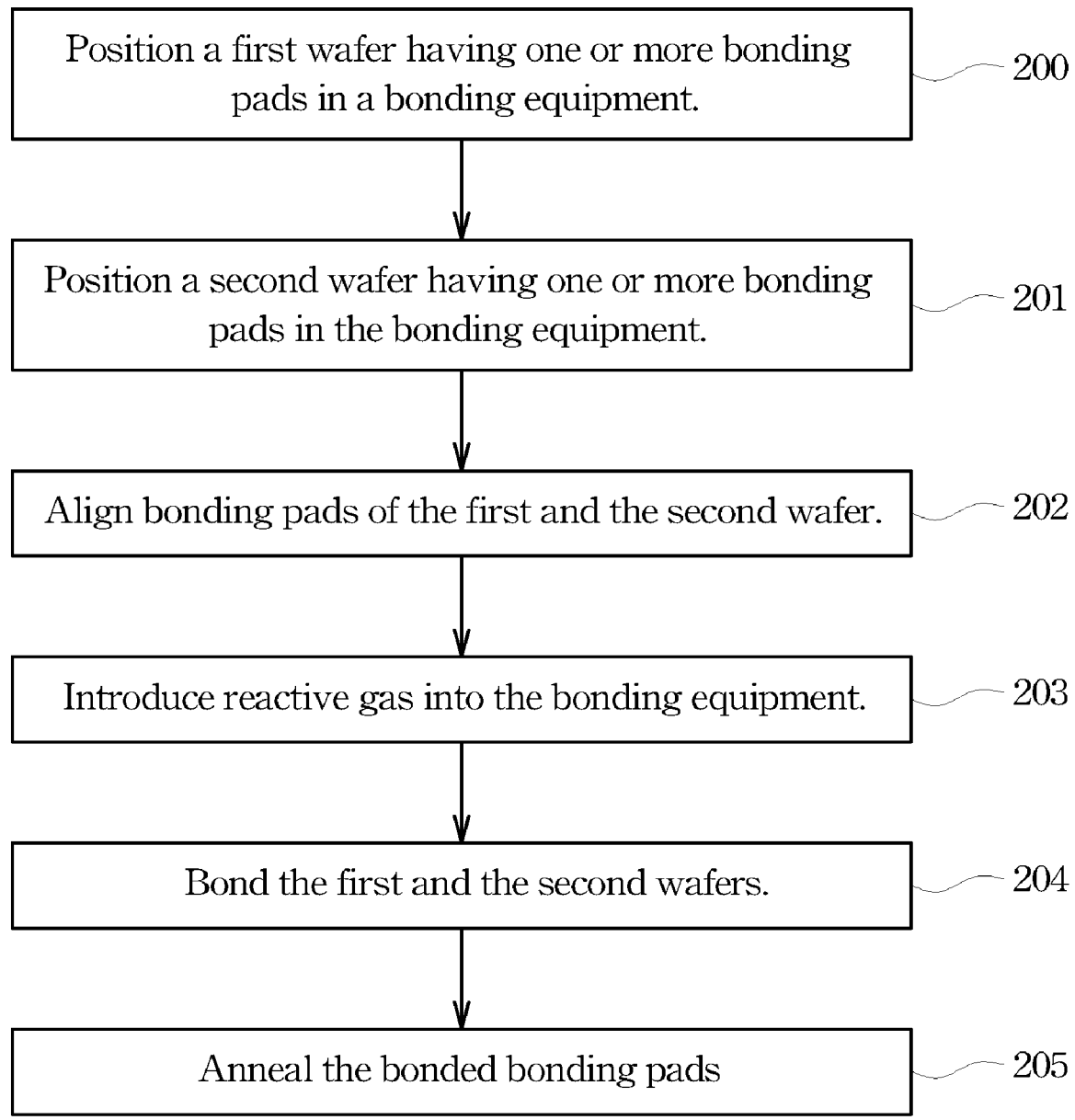
FIG. 2 is a flowchart illustrating example steps executed to implement one embodiment of the present invention.

FIG. 2 is a flowchart illustrating example steps executed to implement wafer bonding in one preferred embodiment of the present invention. These steps are preformed to bond a first wafer having one or more bonding pads, such as wafer 11 of FIG. 1J, to a second wafer having one or more bonding pads, such as wafer 12 of FIG. 1J, to form a stacked wafer, such as stacked wafer 12 of FIG. 1K.

In step 200, a first wafer that has one or more bonding pads formed on its top surface is positioned in a wafer bonding equipment. Typically, the first wafer is fixed to a wafer holder in the wafer bonding equipment, having its bonding surface facing up. The bonding pads may be slightly elevated from the bonding surface of the first wafer and provide an electrical connection to one or more semiconductor devices formed in the first wafer. In step 201, a second wafer that has one or more bonding pads formed on its bonding surface is also positioned in the wafer bonding equipment, having its bonding surface facing the bonding surface of the first wafer. In step 202, the second wafer is aligned with the first wafer so that the bonding pads on the second wafer are substantially aligned and make a firm contact with the bonding pads on the first wafer. A firm contact between the bonding pads on the first wafer and the bonding pads on the second wafer may eliminate voids left on the bonding pads interface due to non-uniformity of the bonding pad surfaces.

In step 203, one or more reactive gases are introduced into the wafer bonding equipment, where the introduced one or more reactive gases may react with the exposed bonding pad materials to form a protective layer over the bonding pads. In one preferred embodiment, copper is the bonding pad material, and silane (SiH4) is introduced into the wafer bonding equipment, which will react with copper to form copper silicide on the exposed copper bonding pads.

In step 204, the first wafer and the second wafer are bonded in a thermal diffusion bonding process by compressing the two wafers using a pressure up to 60 psi pressure at about 245-450° C. temperatures in a reactive gas atmosphere for 5-50 minutes. The optimal bonding temperature and time period depend on the bonding material and the desired reactive conditions for forming the protective layer on bonding pads. In one preferred embodiment, two wafers each having copper bonding pads are bonded using a pressure at about 400° C. in a silane atmosphere for up to 60 minutes. An antioxidation copper silicide protective layer is formed on the exposed copper bonding pads.

In step 205, an anneal process follows bonding step 204 with an elevated temperature of from about 245 to about 450° C. for up to 60 minutes. This anneal process may lead to larger metal grain in the bonding materials and bonding material diffusion at the bonding interface, thus enhancing the bonding quality.

Figure 3:
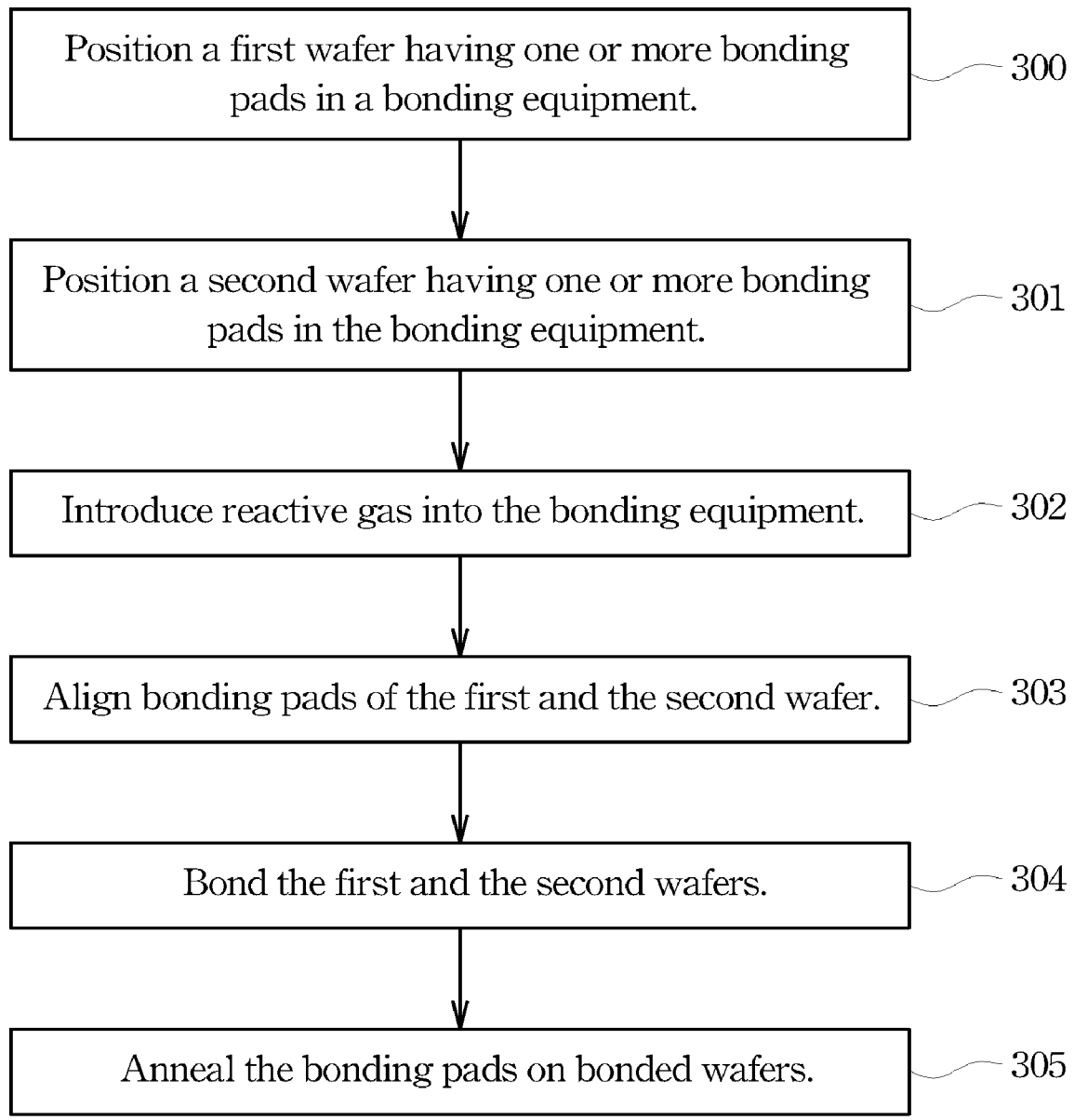
FIG. 3 is a flowchart illustrating example steps executed to implement one embodiment of the present invention.

FIG. 3 is a flowchart illustrating example steps executed to implement wafer bonding in one preferred embodiment of the present invention. In step 300, a first wafer that has one or more bonding pads formed on its top surface is positioned in a wafer bonding equipment. Typically, the first wafer is fixed to a wafer holder in the wafer bonding equipment, having its bonding surface facing up. The bonding pads may be slightly elevated from the bonding surface of the first wafer and provide an electrical connection to one or more semiconductor devices formed in the first wafer.

In step 301, a second wafer that has one or more bonding pads formed on its bonding surface is also positioned in the wafer bonding equipment, having its bonding surface facing the bonding surface of the first wafer. In step 302, one or more reactive gases are introduced into the wafer bonding equipment, where the introduced one or more reactive gases may react with the exposed bonding pad materials to form a protective layer over the bonding pads. In one preferred embodiment, SiH4 is introduced into the wafer bonding equipment for reacting with bonding pad material copper and forming copper silicide on the exposed copper bonding pads.

In step 303, the second wafer is aligned with the first wafer so that the bonding pads on the second wafer are substantially aligned with and contact the bonding pads on the first wafer. In step 304, the first wafer and the second wafer are bonded in a thermal diffusion bonding process by compressing the two wafers using a pressure up to 60 psi at about 250-450° C. temperatures in a reactive gas atmosphere for about 5-50 minutes. The optimal bonding temperature and time period depend on the bonding material and the desired reactive conditions for forming the protective layer on bonding pads. In one preferred embodiment, two wafers each having copper bonding pads are bonded using a pressure at about 400° C. in a SiH4 atmosphere for up to 60 minutes. An antioxidation copper silicide protective layer is formed on the exposed copper bonding pads.

In step 305, an known anneal process, such as one having an elevated temperature of from about 300° C. to about 450° C. for up to 60 minutes in an nitrogen (N2) atmosphere, is performed in order to obtain improved bonding quality, such as larger bonding material metal grain size and bonding material diffusion at the bonding pads interface.

Figure 4:
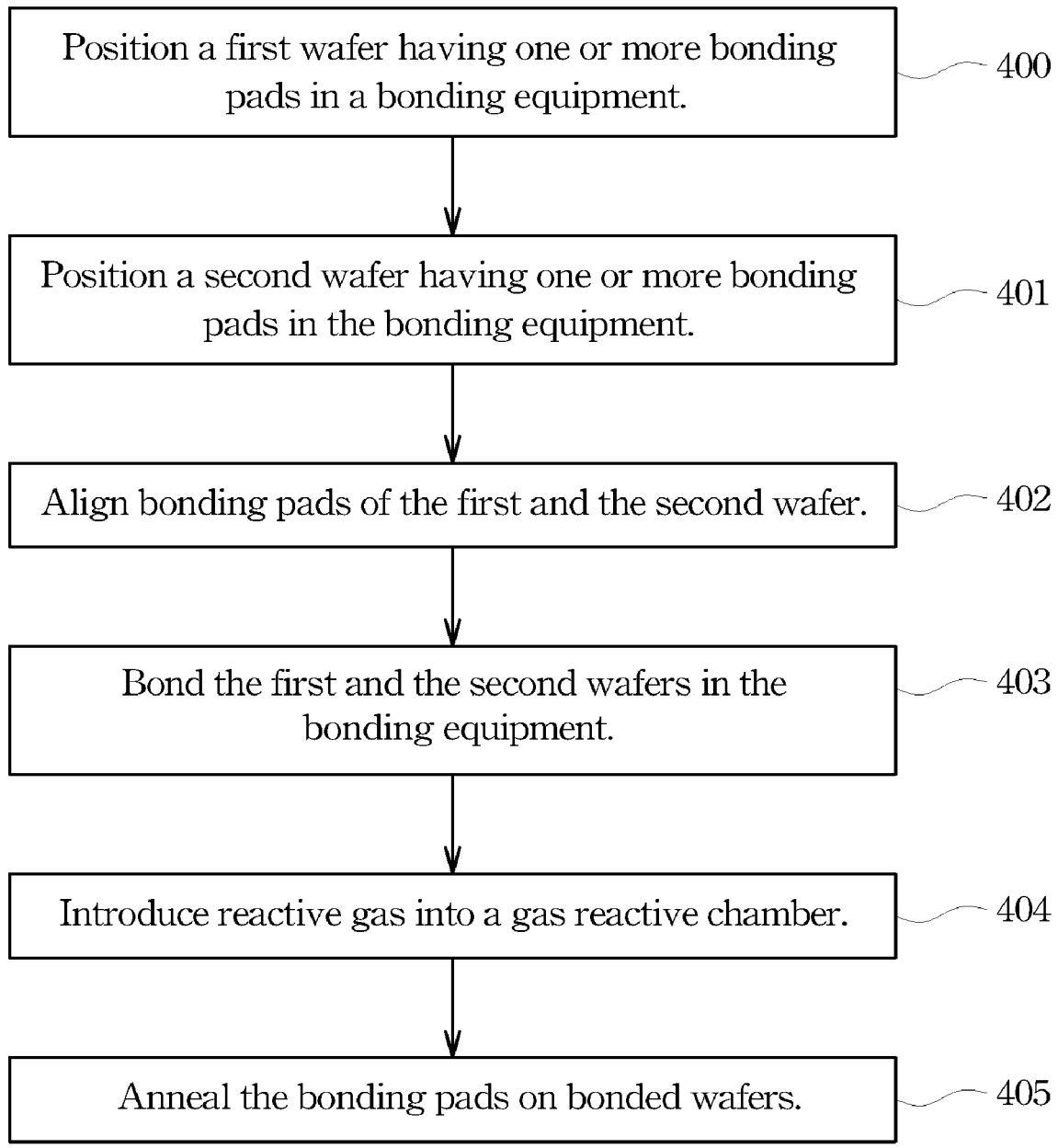
FIG. 4 is a flowchart illustrating example steps executed to implement one embodiment of the present invention.

FIG. 4 is a flowchart illustrating example steps executed to implement wafer bonding in one preferred embodiment of the present invention. In step 400, a first wafer that has one or more bonding pads formed on its top surface is positioned in a wafer bonding equipment. Typically, the first wafer is fixed to a wafer holder in the wafer bonding equipment, having its bonding surface facing up. The bonding pads may be slightly elevated from the bonding surface of the first wafer and provide an electrical connection to one or more semiconductor devices formed in the first wafer.

In step 401, a second wafer that has one or more bonding pads formed on its bonding surface is also positioned in the wafer bonding equipment, having its bonding surface facing the bonding surface of the first wafer. In step 402, the second wafer is aligned with the first wafer so that the bonding pads on the second wafer are substantially aligned with and contact the bonding pads on the first wafer.

In step 403, the first wafer and the second wafer are bonded in a thermal diffusion bonding process by compressing the two wafers using a pressure up to 60 psi at about 250-450° C. temperatures in a N2 or air atmosphere gas atmosphere for about 5-50 minutes. In step 404, one or more reactive gases are introduced into a reactive chamber where the introduced one or more reactive gases react with the exposed bonding pad materials to form a protective layer over the bonding pads. It is noted that the reactive chamber may be the wafer bonding equipment where wafer bonding of step 403 takes place. However, the reactive chamber may also be a separate chamber. In one preferred embodiment, bonded wafers from step 403 are first unloaded from the wafer bounding equipment and then reloaded into the reactive chamber. SiH4 is subsequently introduced into the reactive chamber to react with bonding pad material copper at about 400° C. temperature in a SiH4 atmosphere for up to 60 minutes. As a result, a copper silicide protective layer is formed on the exposed copper bonding pads.

In step 405, an anneal process is performed in order to obtain improved bonding quality as explained previously. It is noted that anneal step 405 may be performed in the reactive gas chamber where step 404 takes place. As an example, in one preferred embodiment, anneal step 405 is performed with an elevated temperature of from about 300° C. to about 450° C. for up to 60 minutes in a SiH4 gas atmosphere under which copper silicide protective layer is formed over the exposed copper bonding pads. In another preferred embodiment, anneal step 405 is performed in the reactive gas chamber in a N2 gas atmosphere with an elevated temperature of from about 250° C. to about 450° C. for about 15 minutes. However, anneal step 405 may be also performed in a separate anneal facility. In a further preferred embodiment, anneal step 405 is performed in an anneal furnace having an elevated temperature of from about 300° C. to about 450° C. for up to 60 minutes in an N2 atmosphere. It can be recognized that, in the current process flow, the process steps of bonding, protective layer formation, and anneal may be performed in separate processing facilities, thus offering improved process flexibility.

Figure 5:
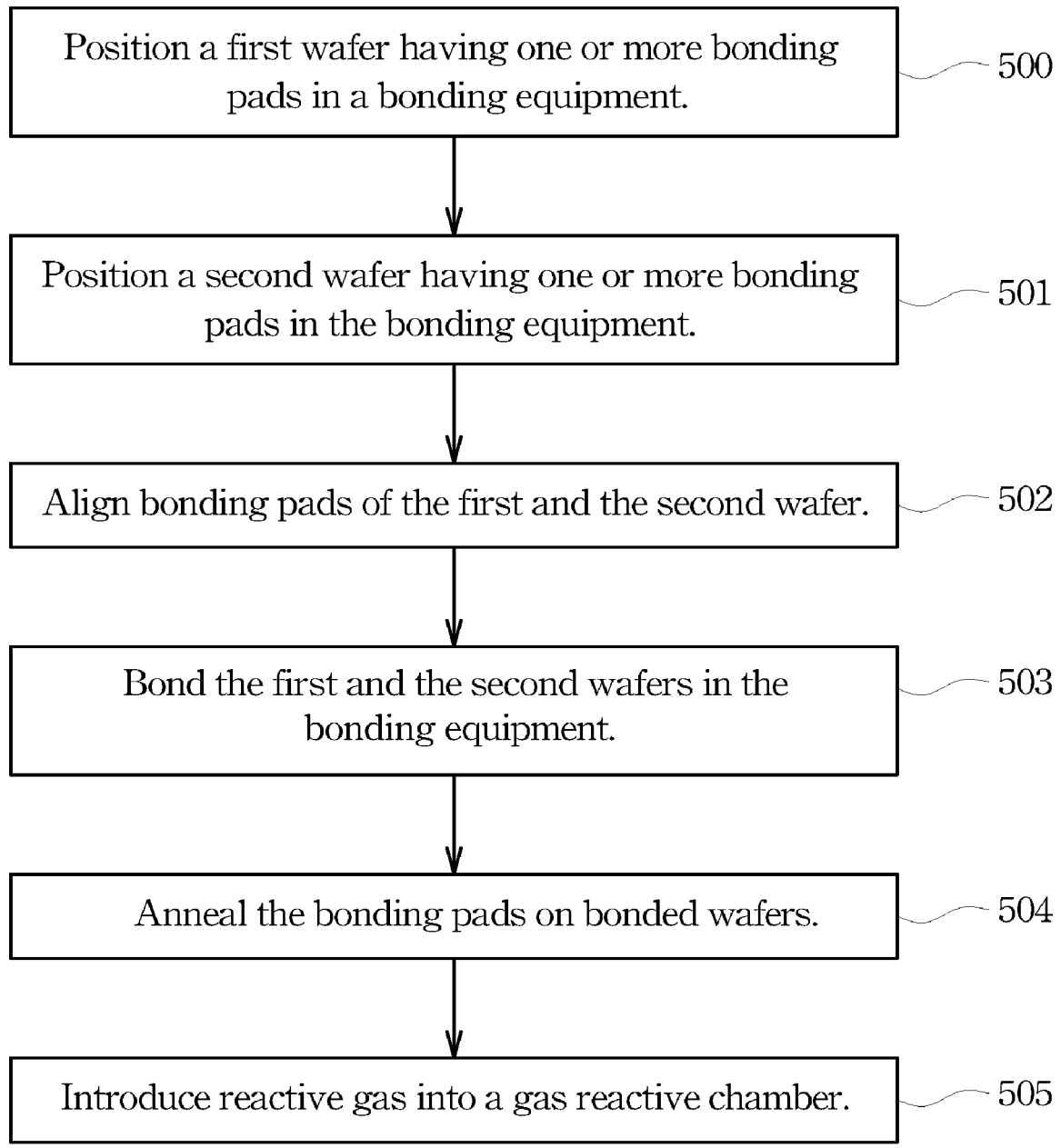
FIG. 5 is a flowchart illustrating example steps executed to implement one embodiment of the present invention.

FIG. 5 is a flowchart illustrating example steps executed to implement wafer bonding in one preferred embodiment of the present invention. In step 500, a first wafer that has one or more bonding pads formed on its top surface is positioned in a wafer bonding equipment. Typically, the first wafer is fixed to a wafer holder in the wafer bonding equipment, having its bonding surface facing up. The bonding pads may be slightly elevated from the bonding surface of the first wafer and provide an electrical connection to one or more semiconductor devices formed in the first wafer.

In step 501, a second wafer that has one or more bonding pads formed on its bonding surface is also positioned in the wafer bonding equipment, having its bonding surface facing the bonding surface of the first wafer. In step 502, the second wafer is aligned with the first wafer so that the bonding pads on the second wafer are substantially aligned with and contact the bonding pads on the first wafer.

In step 503, the first wafer and the second wafer are bonded in a thermal diffusion bonding process by compressing the two wafers using a pressure up to 60 psi at about 250-450° C. temperatures in a N2 or air atmosphere gas atmosphere for about 5-50 minutes. In step 504, an anneal process is performed on the bonded wafers for the same reasons as explained previously. Anneal step 504 may be performed in the wafer bonding equipment where step 503 takes place. Anneal step 504 may also be performed in a separate facility. As an example, in one preferred embodiment, anneal step 504 is performed in a known anneal furnace with an elevated temperature of from about 250° C. to about 450° C. for up to 60 minutes in a N2 gas atmosphere.

In step 505, one or more reactive gases are introduced into a reactive chamber where the introduced one or more reactive gases react with the exposed bonding pad materials of the bonded wafers from step 503 to form a protective layer over the exposed bonding pads. In one preferred embodiment, bonded wafers having annealed copper bonding pads from step 504 are loaded into a gas reactive chamber. SiH4 is subsequently introduced into the gas reactive chamber to react with the exposed bonding pad material copper at about 400° C. temperature for up to 60 minutes. As a result, a copper silicide protective layer is formed on the exposed copper bonding pads of the bonded wafers. It is recognized that the current process flow offers the process flexibility of performing bonding, annealing, and forming protective layer in separate processing facilities.

It should be noted that, although wafer 10 and wafer 11 are used as an example to illustrate the various process flows of wafer bonding and forming bonding pad protective layer in preferred embodiments, in practice, the structures to be bonded may be either a wafer or an integrated circuit die. The various process flows described above can be readily used to form bonding and bonding pads protective layer on the various types stacked circuit configurations.

It should also be noted that the different layers described in the illustrated embodiments may comprise various different materials depending on the desired function or availability that the manufacturer determines. The metals used for the metallized bonding pads may be any suitable metal or alloy, such as copper, tungsten, gold, aluminum, aluminum-copper, copper-tin alloy, gold-tin alloy, indium-gold alloy, lead-tin alloy, copper-silver-tin alloy, combinations thereof, or the like. Moreover, depending on the desired use or function of the different dielectric or insulating layers, any such dielectric material may be used, such as silicon dioxide, silicon nitride, silicon carbide, silicon oxynitride, and the like. The present invention is not limited to use with only a certain limited number of compounds and materials.

It should further be noted that the different layers and recesses in the illustrated embodiments may be deposited or created using any number of a variety of known processes. For example, creation of the various layers of oxides, dielectrics, or other layers may be accomplished through chemical vapor deposition (CVD), atomic layer deposition (ALD), or the like. Moreover, removing material from the wafer may be accomplished through dry or wet etching, chemical mechanical polishing (CMP), or the like. The present invention is not limited to any single such method.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A stacked integrated circuit (IC) comprising:
a first semiconductor die having a front side and a back side, wherein said first semiconductor die comprises one or more first devices;
a first insulation layer on said front side of said first semiconductor die;
one or more first bonding pads disposed on the insulation layer and electrically connected to respective said one or more first devices, wherein each of the one or more first bonding pads has a bonding surface and a perimeter surface;
a second semiconductor die bonded to said first semiconductor die at said bonding surface of the one or more first bonding pads; and
a conductive protective layer disposed on the perimeter surface of each of the one or more bonding pads in a gap between said insulation layer and said second semiconductor die.

2. The stacked IC of claim 1 further comprising:
one or more through silicon vias (TSVs) running through a substrate and said front-side insulation layer of said first semiconductor die.

3. The stacked IC of claim 2 wherein said first insulation layer comprises:
an interlayer dielectric (ILD) layer on said front-side of said first semiconductor die, said ILD layer having one or more contacts connected to a front side of respective said one or more TSVs;
an intermetal dielectric (IMD) layer on said ILD layer, said IMD layer having the one or more first bonding pads electrically connected to respective said one or more contacts; and
a metallization layer on said back side of said first semiconductor die, the metallization layer having one or more back side contacts electrically connected to a back side of respective said one or more TSVs.

4. The stacked IC of claim 1 wherein said one or more first bonding pads consist essentially of a material selected from the group consisting of copper, tungsten, gold, aluminum, aluminum copper, copper-tin alloy, gold-tin alloy, indium-gold alloy, lead-tin alloy, copper-silver-tin alloy, and combinations thereof.

5. The stacked IC of claim 1 wherein said protective layer consists essentially of a material selected from a group consisting of copper silicide, tungsten silicide, gold silicide, aluminum silicide, silicide metal alloy, and combinations thereof.

6. The stacked IC of claim 1 wherein said one or more first bonding pads of said first semiconductor die are elevated from a surface of said insulation layer.

7. The stacked IC of claim 1 wherein said second semiconductor die comprises:
one or more second devices; and
an insulation layer on a front side of said second semiconductor die, having one or more bonding pads electrically connected to respective said one or more first bonding pads of said first semiconductor die at a first end and to respective said one or more second devices in said second semiconductor die at a second end.

8. The stacked IC of claim 1 further comprising:
a third semiconductor die having one or more third bonding pads electrically connected to respective one or more third devices in said third semiconductor die, wherein said third semiconductor die is connected to the back side of said first semiconductor die at said one or more third bonding pads of said third semiconductor die.

9. A method of fabricating a stacked integrated circuit (IC) semiconductor die comprising:
providing a first semiconductor die having one or more first bonding pads on a front side of said first semiconductor die;
providing a second semiconductor die having one or more second bonding pads on a front side of said second semiconductor die;
positioning said first and said second semiconductor dies such that said one or more first bonding pads on said first semiconductor die are aligned and brought into contact with respective said one or more second bonding pads on said second semiconductor die;
bonding said one or more first bonding pads on said first semiconductor die to respective said one or more second bonding pads on said second semiconductor die; and
forming a conductive protective layer on exposed portions of said one or more first and one or more second bonding pads between said front side of said first semiconductor die and said front side of said second semiconductor die.

10. The method of claim 9 wherein said forming comprises:
exposing said exposed portions of said one or more first and one or more second bonding pads to a reactive gas.

11. The stacked IC of claim 9 wherein said first and second semiconductor dies are part of a first and a second semiconductor wafer, respectively.

12. The method of claim 9, further comprising annealing said one or more first and one or more second bonding pads.

13. The method of claim 9, further comprising:
   forming a first insulation layer on said front side of said first semiconductor die and a second insulation layer on said front side of said second semiconductor die prior to said bonding;
   creating one or more through silicon vias (TSVs) running through a substrate and said first insulation layer of said first semiconductor die after forming said first insulation layer;
   thinning a back-side of said first semiconductor die after said bonding; and
   forming a metallization layer on said back side of said first semiconductor die after said thinning.

14. The method of claim 9 wherein said bonding is a thermal diffusion bonding process.

15. The method of claim 9 wherein said one or more first and one or more second bonding pads consist essentially of a material selected from the group consisting of copper, tungsten, gold, aluminum, aluminum copper, copper-tin alloy, gold-tin alloy, indium-gold alloy, lead-tin alloy, copper-silver-tin alloy, combinations thereof, and combinations thereof.

16. The method of claim 9 wherein said protective layer consists essentially of a material selected from the group consisting of copper silicide, tungsten silicide, gold silicide, aluminum silicide, silicide metal alloy, and combinations thereof.

17. A method of fabricating a stacked integrated circuit (IC) comprising steps in an order of:
   providing a first semiconductor die having one or more first bonding pads on a first front side of said first semiconductor die and a second semiconductor die having one or more second bonding pads on a second front side of said second semiconductor die;
   positioning said first and said second semiconductor dies in a bonding equipment chamber such that said one or more first bonding pads on said first semiconductor die are aligned and brought into contact with respective said one or more second bonding pads on said second semiconductor die;
   introducing a reactive gas into said bonding equipment chamber, wherein said reactive gas reacts with exposed portions of said one or more first and said one or more second bonding pads;
   bonding said one or more first bonding pads on said first semiconductor die to respective said one or more second bonding pads on said second semiconductor die with said bonding equipment; and
   annealing said one or more first bonding pads of said first semiconductor die and said one or more second bonding pads of said second semiconductor die.

18. The method of claim 17 wherein said reactive gas is silane and reacts with an exposed copper portion of said one or more first and said one or more second bonding pads forming a copper silicide protective layer.

* * * * *